(12) United States Patent
Qiu (10) Patent No.: US 11,890,783 B2
(45) Date of Patent: Feb. 6, 2024

(54) PRODUCTION METHOD OF WAFER

(71) Applicant: DISCO CORPORATION, Tokyo (JP)

(72) Inventor: Xiaoming Qiu, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 546 days.

(21) Appl. No.: 17/232,204

(22) Filed: Apr. 16, 2021

(65) Prior Publication Data

US 2021/0339428 A1      Nov. 4, 2021

(30) Foreign Application Priority Data

May 1, 2020   (JP) ................................. 2020-081276

(51) Int. Cl.
| | | |
|---|---|---|
| B28D 5/00 | (2006.01) | |
| B23K 26/53 | (2014.01) | |
| B23K 103/00 | (2006.01) | |
| B23K 101/40 | (2006.01) | |
| H01L 29/16 | (2006.01) | |

(52) U.S. Cl.
CPC ............ *B28D 5/0011* (2013.01); *B23K 26/53* (2015.10); *B28D 5/0076* (2013.01); *B23K 2101/40* (2018.08); *B23K 2103/52* (2018.08); *B28D 5/0094* (2013.01); *H01L 29/1608* (2013.01)

(58) Field of Classification Search
CPC .. B28D 5/0011; B28D 5/0076; B28D 5/0094; B28D 5/047; B23K 26/53; B23K 2101/40; B23K 2103/52; B23K 26/38; B23K 26/08; H01L 29/1608; H01L 21/0201; H01L 21/02002; H01L 21/02052; B26D 7/086; B26F 3/004; B08B 3/02; B08B 3/12
USPC ......................................................... 438/739
See application file for complete search history.

(56) References Cited

U.S. PATENT DOCUMENTS

| | | | | |
|---|---|---|---|---|
| 2018/0154543 | A1* | 6/2018 | Hirata ..................... | B26F 3/002 |
| 2018/0229331 | A1* | 8/2018 | Hirata ................. | H01L 21/0201 |
| 2019/0160708 | A1* | 5/2019 | Hinohara ............. | B28D 5/0011 |
| 2019/0304800 | A1* | 10/2019 | Yamamoto ............. | B28D 5/047 |

FOREIGN PATENT DOCUMENTS

| | | |
|---|---|---|
| JP | 2018133485 A | 8/2018 |
| JP | 2019096751 A | 6/2019 |

* cited by examiner

*Primary Examiner* — Duy Vu N Deo
(74) *Attorney, Agent, or Firm* — Greer Burns & Crain Ltd.

(57) ABSTRACT

A production method of a wafer includes a wafer production step in which ultrasonic water is ejected against an end face of an ingot with cleavage layers created therein, thereby severing the wafer from a rest of the ingot to produce the wafer.

5 Claims, 7 Drawing Sheets

PRODUCTION METHOD OF WAFER

BACKGROUND OF THE INVENTION

Field of the Invention

The present invention relates to a production method of a wafer.

Description of the Related Art

According to the conventional techniques disclosed in JP 2018-133485A and JP 2019-096751A, a laser beam of a wavelength having transmissivity through an SiC ingot is emitted to the SiC ingot. In a portion of the SiC ingot at a depth which corresponds to a thickness of a wafer to be produced from one face of the SiC ingot, multiple cleavage layers are hence formed each including a modified portion and cracks extending from the modified portion along a c-plane. Severing is then performed by using the cleavage layers as starting interfaces, so that an SiC wafer is produced.

The production of the SiC wafer is enabled by allowing ultrasonic vibrations to propagate to the cleavage layers and connecting the cleavage layers one another. For the propagation of ultrasonic vibrations to the cleavage layers as described above, the one face of the SiC ingot is first immersed in water after the formation of the cleavage layers. Ultrasonic vibrations generated from an ultrasonic transducer are then allowed to propagate from the one face of the SiC ingot to the cleavage layers via water, so that the wafer is severed.

SUMMARY OF THE INVENTION

In the conventional severing method, however, the one face of the SiC ingot is immersed in water, and ultrasonic vibrations are concurrently allowed to propagate to the entirety of the one face of the SiC ingot. Therefore, a large ultrasonic transducer is needed, and it takes time until the entire face is severed. The conventional severing method is hence costly and inefficient. In addition, the water is contaminated by the severing and needs to be replaced.

It is therefore an object of the present invention to provide a production method of a wafer which can shorten the time required for severing the wafer when producing the wafer by severing it from an SiC ingot.

In accordance with an aspect of the present invention, there is provided a production method of a wafer from a single-crystal SiC ingot having a planar end face, a c-axis, and a c-plane that intersects the c-axis at right angles. The production method includes a cleavage layer creation step of applying a laser beam of a wavelength having transmissivity through single-crystal SiC to the planar end face of the single-crystal SiC ingot, with a focal point of the laser beam positioned in the single-crystal SiC ingot at a wafer depth that is a depth corresponding to a thickness of the wafer to be produced, and then repetitively moving the single-crystal SiC ingot and the focal point relative to each other in a direction parallel to the end face such that multiple cleavage layers each of which contains a modified portion and cracks formed isotropically from the modified portion in the c-plane are created; and a wafer production step of, after performing the cleavage layer creation step, ejecting ultrasonic water to which ultrasonic vibrations have propagated, from an ultrasonic water ejection nozzle against the end face of the single-crystal SiC ingot, the end face being on a side where the wafer is to be produced, and at the same time, moving the single-crystal SiC ingot and the ultrasonic water ejection nozzle relative to each other in the direction parallel to the end face, thereby severing the wafer along the cleavage layers as starting interfaces to produce the wafer.

Preferably, in the single-crystal SiC ingot, the c-axis may be inclined at an off-angle relative to a normal to the end face, and an angle equal to the off-angle may be formed between the c-plane and the end face. The cleavage layer creation step may include linearly moving the focal point of the laser beam applied to the end face, along a second direction intersecting, at right angles, a first direction that is a direction with the off-angle formed therein, so as to continuously form, along the second direction, one of the cleavage layers each of which contains the modified portion and the cracks, index-feeding the single-crystal SiC ingot and the focal point relative to each other in the first direction in a range not exceeding a width of the cracks, and then alternately repeating the linear moving and the index-feeding so as to sequentially form the multiple cleavage layers along the second direction.

Preferably, the ultrasonic water ejection nozzle may include a dome-shaped ultrasonic transducer that has a recessed surface and generates ultrasonic vibrations when supplied with high-frequency electric power, a ring-shaped plate extending outward from an outer periphery of the ultrasonic transducer, and a box supporting the ring-shaped plate and having a water-holding portion that holds water on a side of the recessed surface of the ultrasonic transducer, a water supply port that supplies water to the water-holding portion, and an ejection bore that opposes the recessed surface of the ultrasonic transducer and ejects the water from the water-holding portion. The wafer production step may include supplying the high-frequency electric power to the ultrasonic transducer so as to form, in the ejection bore, a point of concentration of the ultrasonic vibrations generated from the ultrasonic transducer.

Preferably, the high-frequency electric power may have a frequency of 20 kHz to 1 MHz.

Preferably, the production method may further include a peeling step of peeling the wafer that has been severed in the wafer production step, from a rest of the single-crystal SiC ingot by peeling means, and a rinsing step of, after performing the peeling step, rinsing a severed surface of the wafer by using the ultrasonic water ejection nozzle.

According to the present invention, a wafer can be severed and produced from a single-crystal SiC ingot in which cleavage layers have been created, by ejecting ultrasonic water against an end face of the single-crystal SiC ingot. Compared with the conventional configuration that one face of a single-crystal SiC ingot is immersed in water and ultrasonic vibrations are allowed to concurrently propagate to the entirety of the one face of the single-crystal SiC ingot so as to sever a wafer, the present invention can therefore shorten the time required for severing the wafer and can also downsize an ultrasonic water ejection nozzle. Consequently, the present invention can realize an improvement in the efficiency and a reduction in the cost of wafer severing.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

A production method of a wafer, which pertains to an embodiment of the present invention and may hereinafter be called "the wafer production method," produces a wafer from a single-crystal SiC ingot having a c-axis and a c-plane that intersects the c-axis at right angles. The wafer production method according to the embodiment includes a cleavage layer creation step, a wafer production step, a peeling step, and a rinsing step.

Figure 1A:
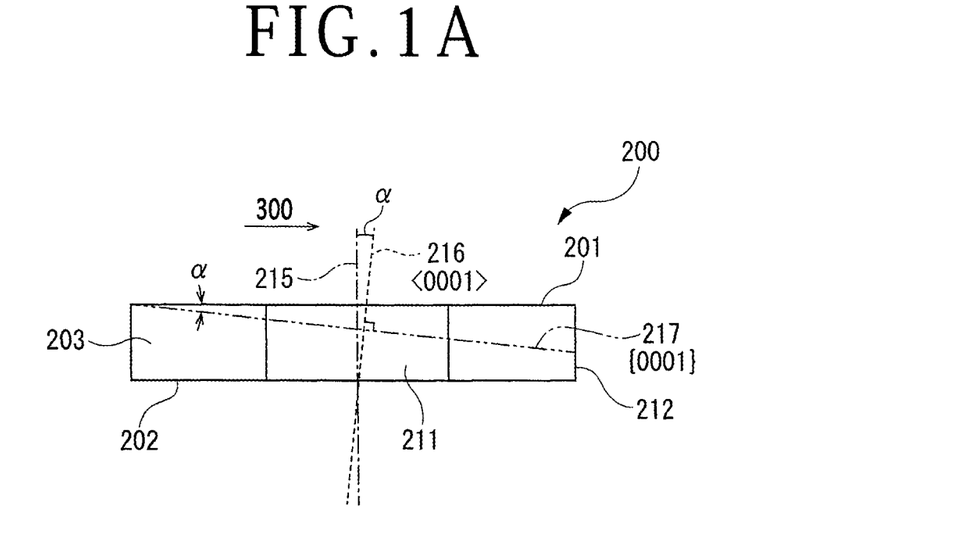
FIG. 1A is a front view of a single-crystal SiC ingot.

A description will first be made about the configuration of the single-crystal SiC ingot. As illustrated in FIG. 1A which is a front view of a single-crystal SiC ingot 200, the single-crystal SiC ingot (hereinafter simply called "the ingot") 200 is formed in a cylindrical shape as a whole. The ingot 200 has a planar first end face 201 and a second end face 202 on a side opposite to the first end face 201. The first end face 201 of the ingot 200 is used as an end face to which a laser beam is emitted. In addition, a peripheral face 203 is located between the first end face 201 and the second end face 202.

Figure 1B:
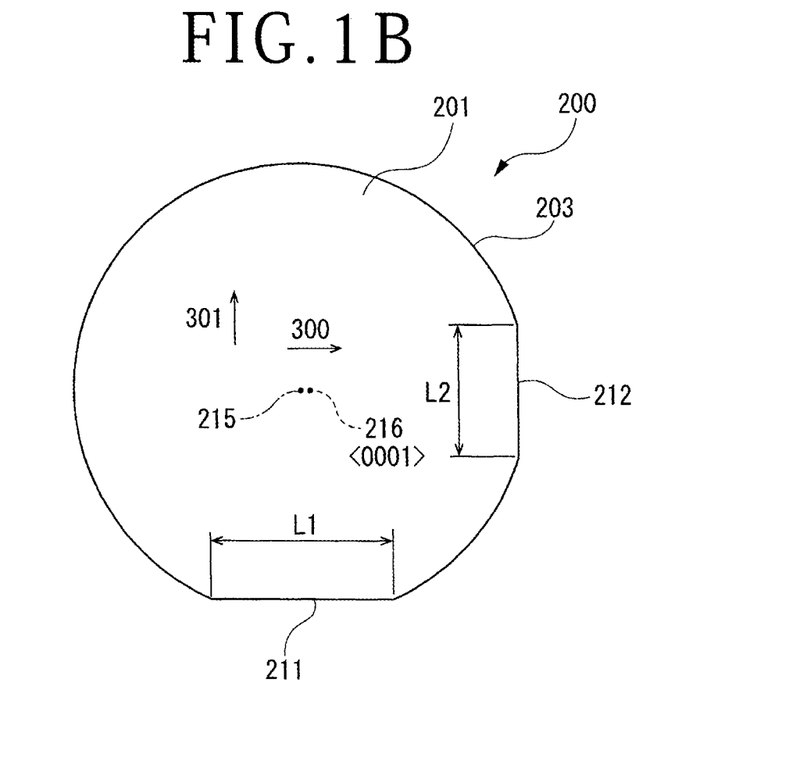
FIG. 1B is a plan view of the single-crystal SiC ingot.

As illustrated in FIG. 1A, the ingot 200 has a c-axis 216 ([0001] direction) and a c-plane 217 ((0001) plane) that intersects the c-axis 216 at right angles. The c-axis 216 extends from the first end face 201 to the second end face 202 and is inclined at an off-angle α relative to a normal 215 to the first end face 201. Therefore, the c-plane 217 is inclined at the same off-angle α relative to the first end face 201. In other words, an angle equal to the off-angle α is formed between the c-plane 217 and the first end face 201. A first direction 300 in which the off-angle α is formed is indicated by a rightward arrow in FIG. 1A and FIG. 1B which is a plan view of the ingot 200.

On the molecular level of the ingot 200, an innumerable number of c-planes 217 are set in the ingot 200. In the embodiment, the off-angle α may be, for example, 1°, 3°, or 6°. The off-angle α can be set as desired, for example, in a range of 1° to 6°.

On the peripheral face 203 of the ingot 200, a first orientation flat 211 and a second orientation flat 212 are formed in a rectangular shape to indicate crystal orientations individually. The first orientation flat 211 is parallel to the direction in which the off-angle α is formed. The second orientation flat 212 intersects, at right angles, the direction in which the off-angle α is formed. As seen from above in FIG. 1B, the second orientation flat 212 has a length L2 shorter than a length L1 of the first orientation flat 211 (L2<L1).

[Cleavage Layer Creation Step]

Figure 2A:
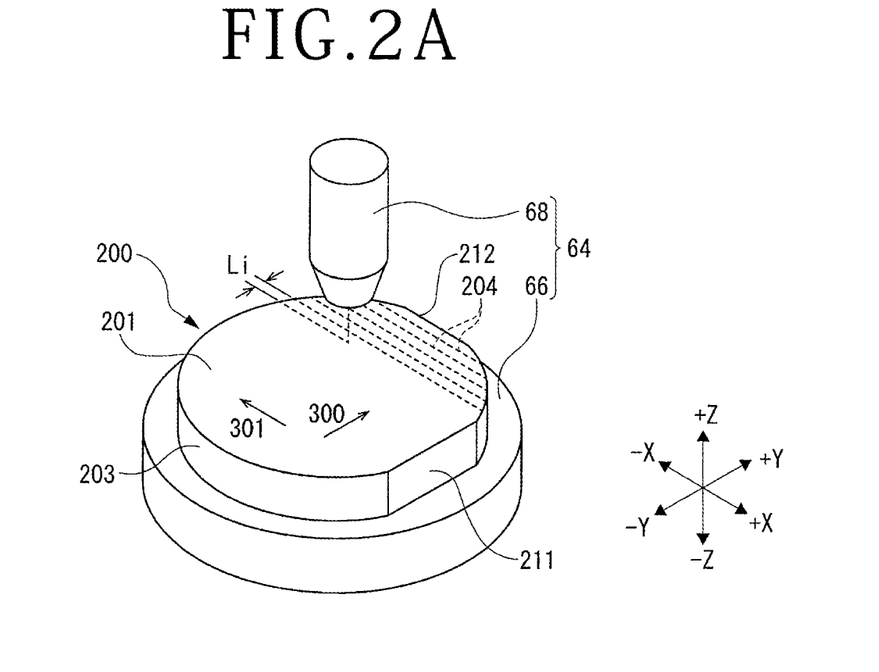
FIG. 2A is a perspective view illustrating the configuration of an essential part of a laser processing machine and modified portions formed by the laser processing machine.
Figure 2B:
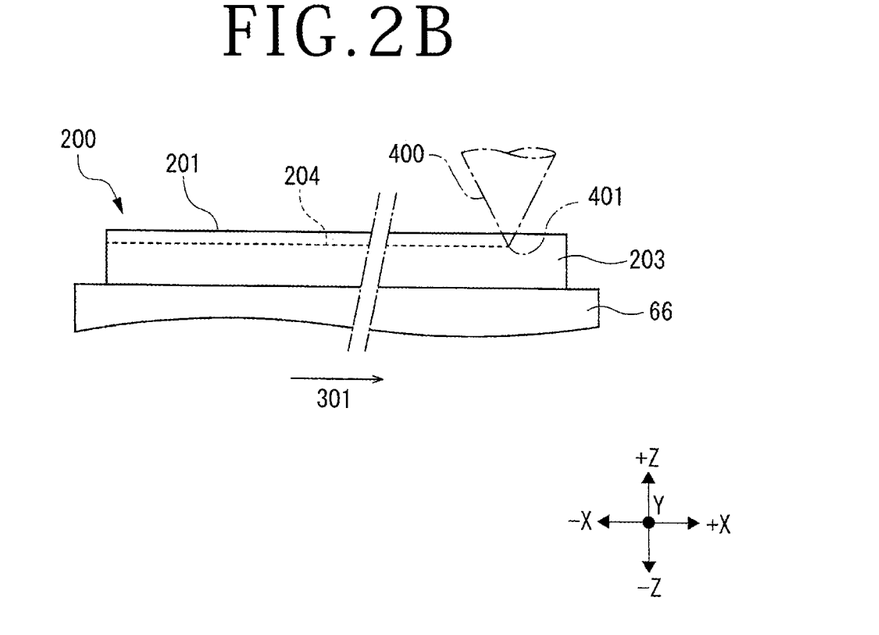
FIG. 2B is a side view illustrating one of the modified portions formed by the laser processing machine.

In the cleavage layer creation step of the wafer production method according to the embodiment, a laser beam is emitted to the ingot 200 described above, so that cleavage layers are formed inside the ingot 200. A laser processing machine 64 illustrated in FIGS. 2A and 2B is therefore used in the embodiment. FIG. 2A is a perspective view illustrating the configuration of an essential part of the laser processing machine 64 and modified portions formed by the laser processing machine 64. FIG. 2B is a side view illustrating one of the modified portions formed by the laser processing machine 64. The laser processing machine 64 includes a chuck table 66 that holds the ingot 200 and a condenser 68 that emits a laser beam 400 to the ingot 200 held on the chuck table 66.

The chuck table 66 is rotated by a rotating mechanism (not illustrated) about an axis extending in a Z-axis direction. Further, the chuck table 66 is advanced and retracted in an X-axis direction by an X-axis direction moving mechanism (not illustrated) and is also advanced and retracted in a Y-axis direction by a Y-axis direction moving mechanism (not illustrated). The X-axis direction and the Y-axis direction define a plane (XY plane) which is substantially horizontal.

The condenser 68 includes a condenser lens (not illustrated). This condenser lens is used to focus the laser beam 400, that is, a pulsed laser beam emitted from a laser oscillator (not illustrated) of the laser processing machine 64 and having transmissivity through single-crystal SiC, and to emit it to the ingot 200.

When it is desired to create cleavage layers in the ingot 200, an operator first places the ingot 200 on a top wall of the chuck table 66 with the first end face 201 of the ingot 200 being directed upward, and then causes the chuck table 66 to hold the ingot 200 under suction. As an alternative, the ingot 200 may be fixed on the chuck table 66 by interposing an adhesive (for example, an epoxy-based adhesive) between the second end face 202 of the ingot 200 and the top wall of the chuck table 66.

The ingot 200 is next imaged from above by an imaging unit (not illustrated) of the laser processing machine 64. Based on an image of the ingot 200 as acquired by imaging means (not illustrated), the chuck table 66 is then moved and rotated by using the X-axis direction moving mechanism, the Y-axis direction moving mechanism, and the rotating mechanism of the laser processing machine 64. In this manner, the direction of the ingot 200 is adjusted to match a predetermined direction, and the position relation between the ingot 200 and the condenser 68 in the XY plane is also adjusted.

When it is desired to adjust the direction of the ingot 200 to match the predetermined direction, the second orientation flat 212 is caused to match the X-axis direction as illustrated in FIG. 2A. As a result, the direction (the second direction 301) which intersects, at right angles, the first direction 300 with the off-angle α formed therein is caused to match the X-axis direction, and the first direction 300 with the off-angle α formed therein is caused to match the Y-axis direction.

The condenser 68 is next caused to ascend or descend by a focal-point position adjusting mechanism (not illustrated) of the laser processing machine 64. As a result, as illustrated in FIG. 2B, the laser beam 400 of the wavelength having transmissivity through single-crystal SiC can be emitted through the first end face 201 of the ingot 200, and a focal point 401 of the laser beam 400 can be positioned at a wafer depth, that is, a depth corresponding to a thickness of a wafer to be produced (a depth from the first end face 201), in the ingot 200.

Cleavage layer creation processing is next performed by moving the focal point 401 and the ingot 200 relative to each other in the second direction. In the cleavage layer creation processing in the embodiment, the chuck table 66 is moved by using the X-axis moving mechanism along the X-axis direction which matches a second direction 301 that intersects, at right angles, the first direction 300 with the off-angle α formed therein.

Figure 3A:
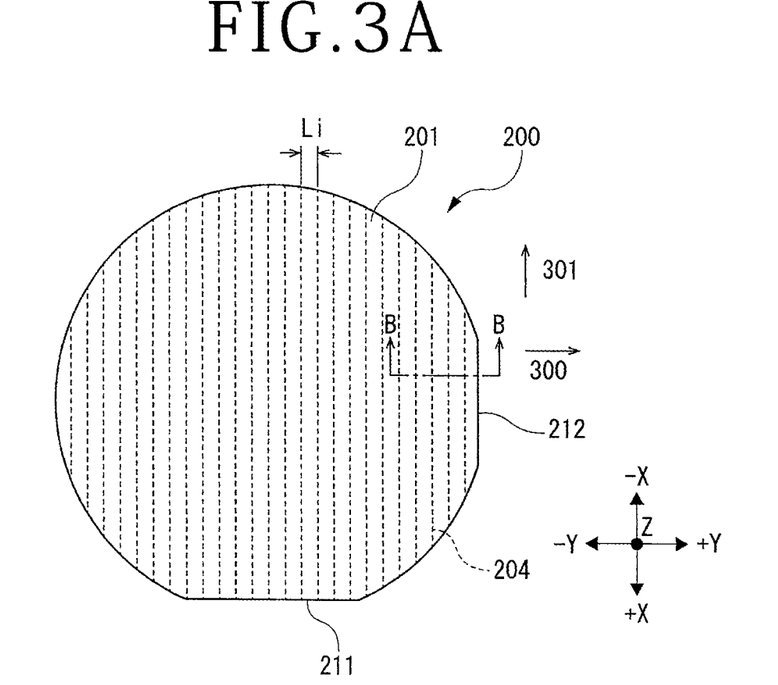
FIG. 3A is a plan view illustrating the single-crystal SiC ingot with cleavage layers created therein.
Figure 3B:
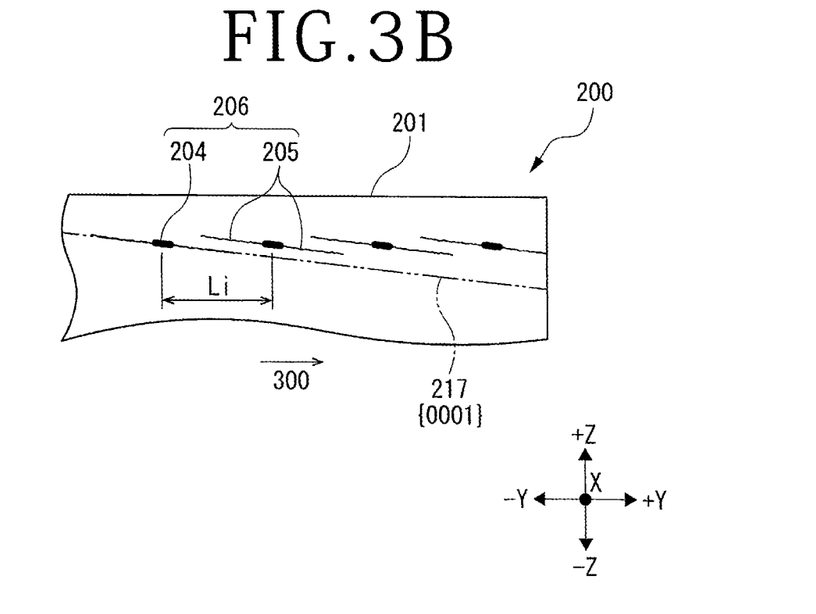
FIG. 3B is a cross-sectional view taken along IIIB-IIIB line in FIG. 3A.

Reference is next had to FIGS. 3A and 3B. FIG. 3A illustrates the ingot 200 with cleavage layers created therein, and FIG. 3B is a cross-sectional view taken along IIIB-IIIB line in FIG. 3A. As illustrated in FIGS. 3A and 3B, modified portions 204 are therefore formed in portions at the wafer depth from the first end face 201 in the ingot 200. In more detail, these modified portions 204 are formed through a mechanism that a portion (SiC) of the ingot 200 dissociates into silicon (Si) and carbon (C) by the emission of the laser beam 400, the laser beam 400 emitted next is absorbed in the C formed previously, and another portion (SiC) of the ingot 200 dissociates into Si and C in a chain manner.

As described above, the modified portions 204 are continuously formed in the second direction 301 intersecting, at right angles, the first direction 300 in which the off-angle α is formed. Further, cracks 205 (the cracks 205 isotropically formed in the c-plane) are formed which extend isotropically from the modified portions 204 along the c-plane. Consequently, multiple cleavage layers 206 each of which contains the modified portion 204 and the cracks 205 formed isotropically from the modified portion 204 in the c-plane are continuously created along the second direction 301.

Following this cleavage layer creation processing, the focal point 401 and the chuck table 66 (i.e., the ingot 200) are subjected to index-feeding relative to each other in the Y-axis direction, which matches the first direction 300 with the off-angle α formed therein, by a predetermined index amount Li in a range not exceeding a width of the cracks 205. In the embodiment, the chuck table 66 is subjected to index-feeding along the Y-axis direction by using the Y-axis direction moving mechanism.

The cleavage layer creation processing and the index-feeding are then alternately repeated. Consequently, the modified portions 204, which continuously extend in the second direction 301 intersecting, at right angles, the first direction 300 with the off-angle α formed therein, can be formed in a plurality of rows at intervals of the predetermined index amount Li in the first direction 300 in which the off-angle α is formed.

Further, as illustrated in FIG. 3B, the cracks 205, which extend from the plural rows of modified portions 204 isotropically along the c-plane, are formed such that the cracks 205 extending from the modified portion 204 in each of the rows, which are adjacent to one another in the first direction 300, and the cracks 205 extending from the modified portion 204 in an adjacent one of the rows overlap each other as seen from above in the Z-axis direction.

In the manner described above, the multiple cleavage layers 206, each of which contains the modified portion 204 and the cracks 205 and extends in the second direction 301, can be created one after another at the wafer depth from the first end face 201 of the ingot 200 at the intervals of the predetermined index amount Li in the first direction 300. These cleavage layers 206 have been lowered in strength due to the modified portions 204 and the cracks 205 and act as interfaces that facilitate severing of a wafer from the rest of the ingot 200.

[Wafer Production Step]

In the wafer production step, a wafer is produced by severing it from the rest of the ingot 200 with the cleavage layers 206 created therein while the cleavage layers are used as starting interfaces. The embodiment hence uses a severing apparatus 1 illustrated in FIG. 4 which is a perspective view of the severing apparatus 1.

Figure 4:
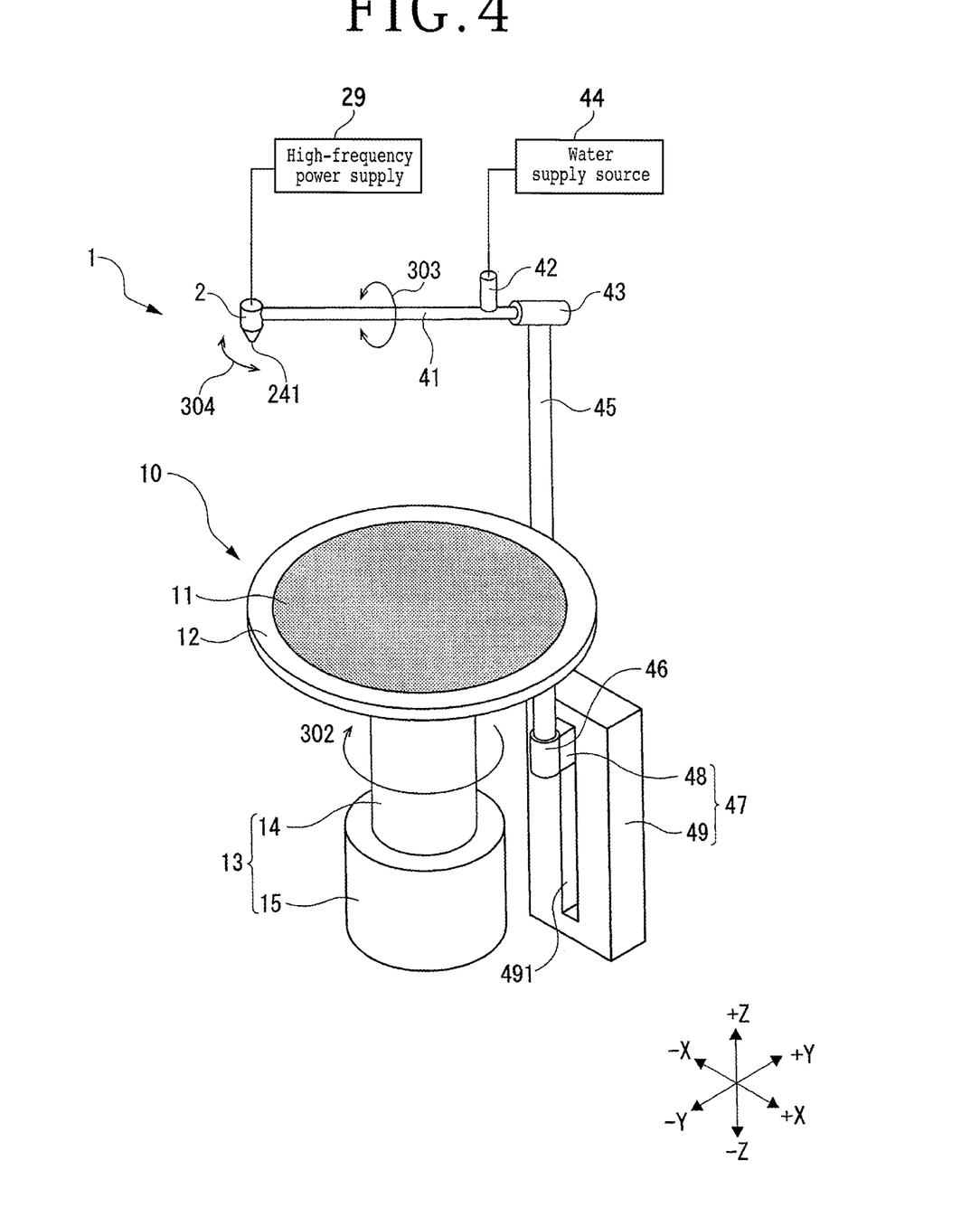
FIG. 4 is a perspective view illustrating a severing apparatus.

The severing apparatus 1 includes a holding table 10, an ultrasonic water ejection nozzle 2, and an unillustrated casing that surrounds the holding table 10. The holding table 10 holds the ingot 200 with the cleavage layers 206 formed therein as illustrated in FIGS. 3A and 3B. The ultrasonic water ejection nozzle 2 ejects ultrasonic water against the ingot 200 held on the holding table 10.

The holding table 10 is formed in the shape of a disc. The holding table 10 includes a holding surface 11 that holds the second end face 202 (see FIG. 1A) of the ingot 200 under suction and a frame 12 that supports the holding surface 11. The holding surface 11 includes a porous member and is communicated to an unillustrated suction source such that the second end face 202 of the ingot 200 placed on the holding surface 11 is held under suction.

In the embodiment, the severing apparatus 1 severs the wafer by ejecting ultrasonic water against the entirety of the first end face 201 as an upper face of the ingot 200 held on the holding surface 11 of the holding table 10.

On a lower side of the holding table 10, a holding table rotating mechanism 13 is arranged. The holding table rotating mechanism 13 includes a spindle 14 as a rotating shaft for the holding table 10 and a motor 15 that rotates the spindle 14. The motor 15 transmits a rotational force to the holding table 10 via the spindle 14. Consequently, the holding table 10 rotates, with the ingot 200 held thereon, about the spindle 14, for example, in a direction indicated by an arrow 302.

The ultrasonic water ejection nozzle 2 ejects ultrasonic water from above against the first end face 201 of the ingot 200 held on the holding surface 11 of the holding table 10. As illustrated in FIG. 4, the ultrasonic water ejection nozzle 2 is secured to a distal end of a water supply pipe 41 that is turnable above the holding table 10.

The water supply pipe 41 extends in a horizontal direction and is communicated on the side of a proximal end thereof to a water supply source 44 via a joint 42. The water supply source 44 includes a pump or the like and is configured to deliver water to the ultrasonic water ejection nozzle 2 via the water supply pipe 41.

To the proximal end of the water supply pipe 41, a first motor 43 is connected to rotate the water supply pipe 41 and the ultrasonic water ejection nozzle 2 about an axis of the water supply pipe 41. The water supply pipe 41 and the ultrasonic water ejection nozzle 2 are rotated by the first motor 43 as indicated by an arrow 303.

To a lower end of the first motor 43, a rotating shaft 45 for the water supply pipe 41 is connected. This rotating shaft 45 holds and rotates the ultrasonic water ejection nozzle 2, the water supply pipe 41, and the first motor 43. The rotating shaft 45 extends in the Z-axis direction, and the first motor 43 is secured to an upper end of the rotating shaft 45. To a lower end of the rotating shaft 45, a second motor 46 is secured to rotate the rotating shaft 45 about its axis. Through rotation of the rotating shaft 45 by the second motor 46, the water supply pipe 41 and the ultrasonic water ejection nozzle 2 are caused to turn as indicated by an arrow 304.

The water supply pipe 41 has a length sufficient to reach from the first motor 43 on the upper end of the rotating shaft 45 to a center of the holding table 10. The rotating shaft 45 can therefore move the ultrasonic water ejection nozzle 2, which is arranged on the distal end of the water supply pipe 41, from an outer peripheral edge to a center of the ingot 200 held on the holding table 10.

Further, the second motor 46 is secured to a lift unit 47. The lift unit 47 includes a housing that includes a slot 491, and a holding member 48 that holds the second motor 46. The holding member 48 is secured to a driving member (not illustrated) accommodated in a housing 49 and projects from the housing 49 via the slot 491. With the second motor 46 held thereon, the holding member 48 is hence movable along the slot 491 in the Z-axis direction.

By this lift unit 47, the rotating shaft 45, the first motor 43, the water supply pipe 41, and the ultrasonic water ejection nozzle 2 can be moved along the Z-axis direction.

Figure 5:
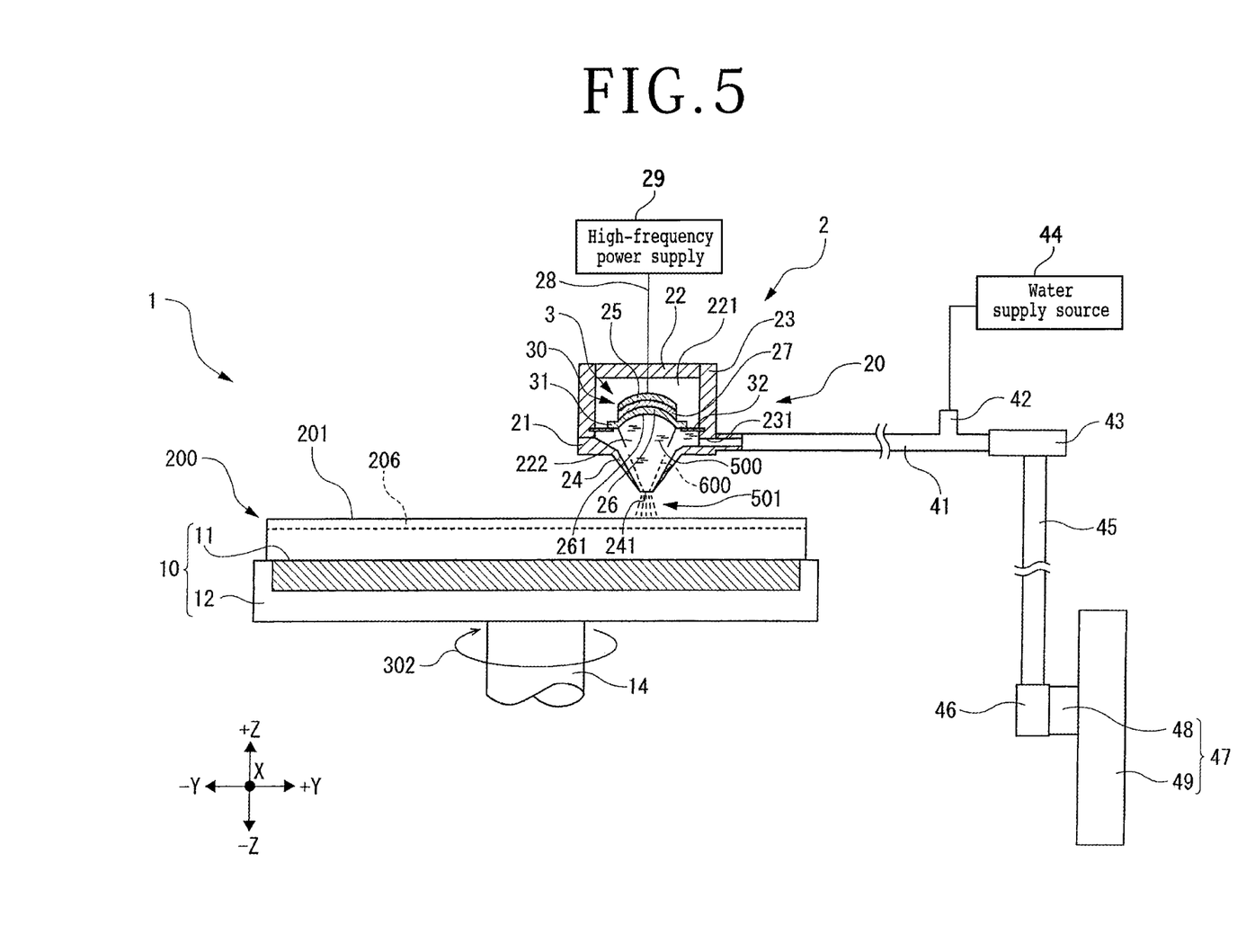
FIG. 5 is a cross-sectional view illustrating an ultrasonic water ejection nozzle in the severing apparatus illustrated in FIG. 4.

The ultrasonic water ejection nozzle 2 is a device which ejects ultrasonic water with ultrasonic vibrations propagated thereto, against the first end face 201 (see FIGS. 3A and 3B) of the ingot 200. As illustrated in FIG. 5 which is a cross-sectional view illustrating the ultrasonic water ejection nozzle 2 in the severing apparatus 1 illustrated in FIG. 4, the ultrasonic water ejection nozzle 2 includes a box 20 that temporarily holds water 500 supplied from the water supply source 44, an ejection bore 241 formed in a lower surface of the box 20, and an ultrasonic transducer 3 arranged in the box 20 so as to oppose the ejection bore 241.

The box 20 is formed, for example, in a substantially cylindrical shape and includes a bottom wall 21, a top wall 22 opposing the bottom wall 21 in the Z-axis direction, and a substantially cylindrical side wall 23 connecting the bottom wall 21 and the top wall 22 together.

The box 20 has an interior divided by the ultrasonic transducer 3 into two compartments, that is, a first compartment 221 on an upper side of the ultrasonic transducer 3 and a second compartment 222 on a lower side of the ultrasonic transducer 3. Extending through the side wall 23 of the second compartment 222 on the lower side, a water supply port 231 is formed.

The water supply port 231 is used to supply the water 500 to the second compartment 222 located between the ultrasonic transducer 3 and the ejection bore 241 in the box 20. To this water supply port 231, the water supply pipe 41 is communicated. Accordingly, the water 500 supplied from the water supply source 44 is temporarily held in the second compartment 222 of the box 20.

In the bottom wall 21, a nozzle portion 24 is formed projecting in a −Z direction. The nozzle portion 24 is gradually reduced in diameter toward a distal end thereof. Further, the nozzle portion 24 includes, at the distal end thereof, the ejection bore 241 through which the water 500 held in the second compartment 222 of the box 20 is ejected. The nozzle portion 24 may have a shape not reduced in diameter toward the ejection bore 241.

The ultrasonic transducer 3 is formed in a dome shape and is configured to generate ultrasonic vibrations when supplied with high-frequency electric power. The ultrasonic transducer 3 allows ultrasonic vibrations 600 to propagate to the water 500 held in the second compartment 222 of the box 20. In the box 20, the ultrasonic transducer 3 is arranged at a position where the ultrasonic transducer 3 opposes the ejection bore 241. The ultrasonic transducer 3 has an arcuate cross-sectional shape and is recessed on a side of a surface thereof directed toward the ejection bore 241. In other words, the ejection bore 241 opposes the recessed surface of the ultrasonic transducer 3.

The ultrasonic transducer 3 has a dome portion 30 and a flange portion 31 extending outward in a radial direction from an outer peripheral edge of the dome portion 30. Further, the flange portion 31 of the ultrasonic transducer 3 is provided, at an outer peripheral edge thereof, with a ring-shaped plate 32 that extends outward in a radial direction. In other words, the ring-shaped plate 32 is disposed so as to extend outward from an outer periphery of the ultrasonic transducer 3.

The dome portion 30 includes a first electrode plate 25, a piezoelectric element 27, and a second electrode plate 26, which are stacked one above another along the Z-axis direction. The first electrode plate 25 and the second electrode plate 26 are made, for example, of a piezoelectric material that is a kind of ceramics. The first electrode plate 25, the piezoelectric element 27, and the second electrode plate 26 are each formed to have a dome shape.

The first electrode plate 25, the piezoelectric element 27, and the second electrode plate 26 are stacked together such that they are directed toward the ejection bore 241 on recessed sides thereof. To the first electrode plate 25 and the second electrode plate 26, unillustrated electrodes are attached. Via these electrodes and wiring 28, a high-frequency power supply 29 is connected to the first electrode plate 25 and the second electrode plate 26.

The high-frequency power supply 29 supplies high-frequency electric power to the ultrasonic transducer 3. In other words, the high-frequency power supply 29 applies a high-frequency alternating current voltage across the first electrode plate 25 and the second electrode plate 26 in the dome portion 30 of the ultrasonic transducer 3. Consequently, the high-frequency power supply 29 supplies high-frequency electric power to the ultrasonic transducer 3.

An upper surface on a protruded side of the second electrode plate 26 is in close contact with a lower surface of the piezoelectric element 27, while a lower surface on a recessed side of the first electrode plate 25 is in close contact with an upper surface of the piezoelectric element 27. The upper surface on the protruded side of the second electrode plate 26 and the lower surface of the recessed side of the first electrode plate 25 hence oppose each other with the piezoelectric element 27 interposed therebetween. The lower surface on the recessed side of the second electrode plate 26, in other words, the lower surface of the dome portion 30 opposing the ejection bore 241, acts as a radiation surface 261 which radiates, with the ultrasonic vibrations 600, the water 500 temporarily held in the second compartment 222 of the box 20.

In the embodiment, the radiation surface 261 of the ultrasonic transducer 3 is formed so as to have a dome shape similar to an inner wall of a portion of a spherical shape. As an alternative, the radiation surface 261 may be formed to have a dome shape similar to an inner wall of a cone. In conclusion, the radiation surface 261 may have any desired configuration insofar as the ultrasonic vibrations 600 concentrate toward the ejection bore 241.

The flange portion 31 has a ring shape and integrally extends outward in a radial direction from an outer peripheral edge of the second electrode plate 26 of the dome portion 30. Similarly to the dome portion 30, this flange portion 31 is made of a piezoelectric material or the like.

The ring-shaped plate 32 extends outward in the radial direction from the outer peripheral edge of the flange portion 31. This ring-shaped plate 32 is supported at an outer peripheral portion thereof on the side wall 23 of the second compartment 222 in the box 20 and fixedly supports the dome portion 30 in a hollow space of the box 20. As described above, the second compartment 222 (and the box 20) supports the ring-shaped plate 32 and functions as a water-holding portion that holds water on the side of the recessed surface of the ultrasonic transducer 3. The outer peripheral portion of the ring-shaped plate 32 is supported at an edge portion thereof on the side wall 23. At a portion not supported on the side wall 23, the ring-shaped plate 32 amplifies the ultrasonic vibrations 600.

A description will hereinafter be made about the wafer production step that uses the above-mentioned severing apparatus 1. As illustrated in FIG. 5, the operator first places the ingot 200 on the holding surface 11 with the first end face 201 directed upward such that the center of the ingot 200 substantially matches a center of the holding surface 11 of the holding table 10. A suction force produced by actuation of the unillustrated suction source is then transmitted to the holding surface 11, so that the holding surface 11 of the holding table 10 holds the second end face 202 of the ingot 200 under suction.

The distance between the ultrasonic water ejection nozzle 2 and the first end face 201 of the ingot 200 is then adjusted by the lift unit 47. Further, the spindle 14 rotates the holding table 10 with the ingot 200 held thereon, in the direction of the arrow 302. In addition, the second motor 46 rotates the rotating shaft 45. Consequently, the ultrasonic water ejection nozzle 2 is moved from a retracted position on an outer side of the holding table 10 to above the ingot 200, and the ejection bore 241 therefore opposes the first end face 201 of the ingot 200.

The water 500 is then delivered at an elevated pressure from the water supply source 44. The water 500 flows through the water supply pipe 41 and is temporarily held in the second compartment 222 in the box 20 of the ultrasonic water ejection nozzle 2.

The water 500 progressively accumulates to a predetermined amount in the second compartment 222 in the box 20, leading to a rise in pressure within the second compartment 222. The water 500 is then ejected downward from the ejection bore 241. It is to be noted that the amount of the water 500 in the second compartment 222 is maintained in the predetermined amount owing to a continued supply of the water 500 from the water supply source 44.

Here, the high-frequency power supply 29 supplies high-frequency electric power of a predetermined frequency (for example, 20 kHz to 1 MHz) to the ultrasonic transducer 3. The on/off of the application of a voltage is therefore repeated at the predetermined frequency by the high-frequency power supply 29. As a result, reciprocating motion occurs in an up-to-down direction at the first electrode plate 25 and the piezoelectric element 27. This reciprocating motion mechanically results in the ultrasonic vibrations 600. The electric energy to be supplied from the high-frequency power supply 29 to the ultrasonic transducer 3 may be, for example, 95 W.

The second electrode plate 26 resonates with vibrations of the first electrode plate 25 and allows the ultrasonic vibrations 600 to propagate from the radiation surface 261, which is the recessed surface gently recessed as seen from the side of the ejection bore 241, to the water 500 temporarily held in the second compartment 222 of the box 20. Further, the ultrasonic vibrations 600, which propagate from the radiation surface 261 as the recessed surface to the water 500, concentrate toward the ejection bore 241. Accordingly, the point of concentration of the ultrasonic vibrations 600 generated from the ultrasonic transducer 3 is formed in the ejection bore 241.

Owing to the propagation of the ultrasonic vibrations 600 as described above, ultrasonic water 501 with the ultrasonic vibrations 600 propagated thereto is ejected outward from the ejection bore 241 of the nozzle portion 24. In other words, in the embodiment, the ultrasonic water 501 is ejected from the ejection bore 241 of the nozzle portion 24 against the first end face 201, which is an end face on a side where a wafer is to be produced in the ingot 200.

Here, the ingot 200 and the ultrasonic water ejection nozzle 2 are moved relative to each other in the direction parallel to the first end face 201 of the ingot 200. In the embodiment, the rotating shaft 45 is rotated by the second motor 46 such that the ultrasonic water ejection nozzle 2 passes above the center of the ingot 200. Accordingly, the ultrasonic water ejection nozzle 2 is turned and moved so as to reciprocate at a predetermined angle above the ingot 200 that is rotating together with the holding table 10. In this manner, the ultrasonic water 501 is ejected against the entirety of the first end face 201 of the ingot 200.

By the ejection of the ultrasonic water 501 as described above, the multiple cleavage layers 206 created side by side in the first direction 300 of the ingot 200 are connected to one another, so that a wafer as a thin disc-shaped object is severed from the rest of the ingot 200 while these cleavage layers 206 are used as starting interfaces. In addition, the first end face 201 of the ingot 200 is rinsed by the ejection of the ultrasonic water 501.

[Peeling Step]

Figure 6:
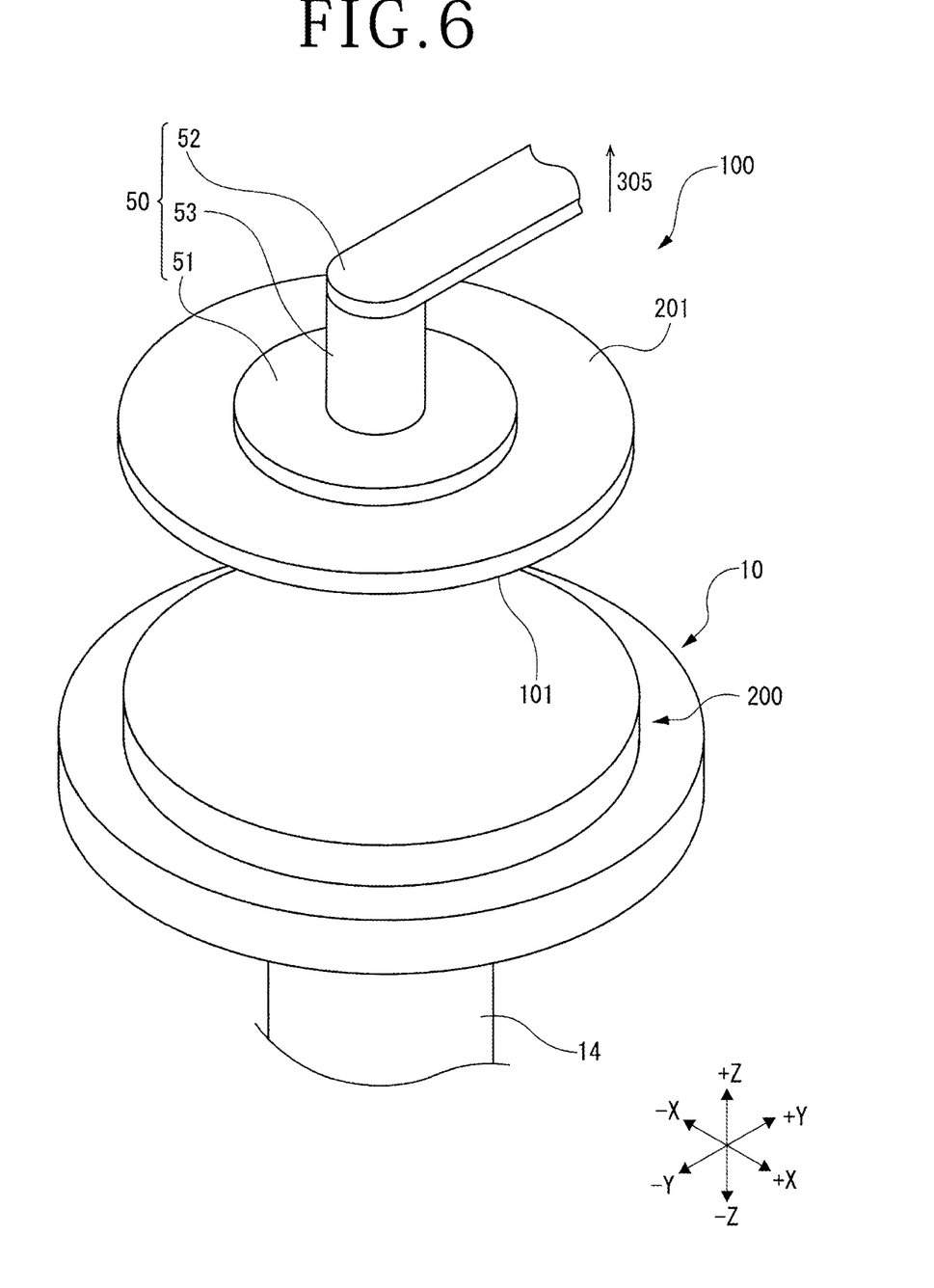
FIG. 6 is a perspective view illustrating a peeling step.

Reference is next had to FIG. 6, which is a perspective view illustrating the peeling step. In the peeling step, the wafer which has been severed in the wafer production step is peeled from the rest of the ingot 200 by peeling means. For this purpose, the severing apparatus 1 includes, as the peeling means, a wafer holding device 50 as illustrated in FIG. 6.

The wafer holding device 50 includes a transfer pad 51, a turnable arm 52, and a connecting portion 53 that connects the transfer pad 51 and the turnable arm 52 together. The transfer pad 51 has a holding surface that is directed downward and is parallel to the XY plane. The turnable arm 52 causes turning of the transfer pad 51.

In the peeling step, the turnable arm 52 is used to arrange the transfer pad 51 above the ingot 200 placed on the holding table 10 of the severing apparatus 1. The transfer pad 51 is then caused to descend by unillustrated vertically moving means such that the first end face 201 of the ingot 200 is held under suction by the transfer pad 51. Subsequently, the transfer pad 51 is caused to ascend by the vertically moving means as indicated by an arrow 305. As a result, a wafer 100, which is an SiC wafer, is peeled from the rest of the ingot 200. The lower surface of the wafer 100 is a surface severed from the rest of the ingot 200, that is, a severed surface 101.

[Rinsing Step]

Figure 7:
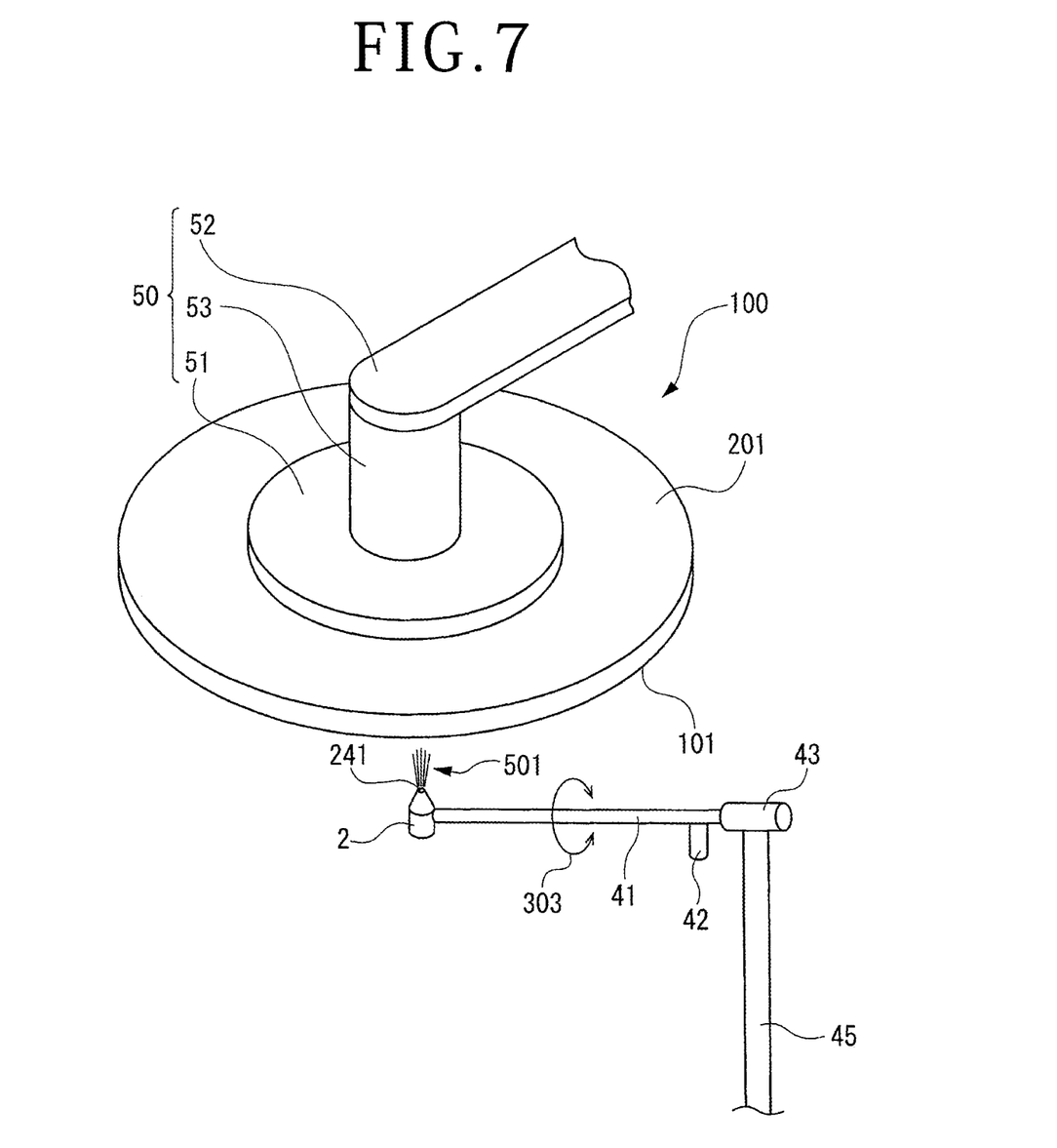
FIG. 7 is a perspective view illustrating a rinsing step.

Reference is next had to FIG. 7, which is a perspective view illustrating the rinsing step. In the rinsing step, the severed surface 101 of the wafer 100 is rinsed by using the ultrasonic water ejection nozzle 2. For this purpose, as illustrated in FIG. 7, the ultrasonic water ejection nozzle 2 is first arranged below the wafer 100 severed from the rest of the ingot 200 and held on the transfer pad 51 of the wafer holding device 50. The water supply pipe 41 is then rotated as indicated by the arrow 303 by the first motor 43, so that the ejection bore 241 of the ultrasonic water ejection nozzle 2 is directed upward. Consequently, the ejection bore 241 of the ultrasonic water ejection nozzle 2 is arranged to face the severed surface 101 of the wafer 100.

Thereafter, the ultrasonic water 501 is ejected from the ejection bore 241 of the ultrasonic water ejection nozzle 2 against the severed surface 101 of the wafer 100 while the ultrasonic water ejection nozzle 2 is caused to turn as needed by the rotating shaft 45. Consequently, the severed surface 101 is rinsed. After the rinsing of the severed surface 101, the wafer 100 held on the transfer pad 51 is transferred to, for example, a predetermined storage site by the turnable arm 52 and the vertically moving means. When the severed surface 101 is rinsed, the high-frequency power supply 29 supplies high-frequency electric power of a predetermined frequency (for example, 500 kHz to 1 MHz) to the ultrasonic transducer 3.

In the embodiment, the ultrasonic water 501 is ejected from the turning ultrasonic water ejection nozzle 2 against the first end face 201 of the ingot 200 while the ingot 200 with the cleavage layers 206 formed therein is rotated. Consequently, the wafer 100 is severed from the rest of the ingot 200, so that the wafer 100 can be produced.

Compared with the conventional configuration that one face of an ingot is immersed in water and ultrasonic vibrations are allowed to concurrently propagate to the entirety of the one face of the ingot to sever a wafer, the embodiment can shorten the time required for severing the wafer and can also downsize the ultrasonic water ejection nozzle 2 and its ultrasonic transducer 3. Consequently, the embodiment can realize an improvement in the efficiency and a reduction in the cost of severing of the wafer 100.

Further, in the embodiment, the dome portion 30 which generates the ultrasonic vibrations 600 is held on the side wall 23 of the box 20 via the ring-shaped plate 32. The dome portion 30 is therefore facilitated to vibrate when high-frequency electric power is supplied to the ultrasonic transducer 3. Consequently, ultrasonic vibrations that are amplified by the ring-shaped plate 32 and have a large amplitude are allowed to effectively propagate to the water 500.

In the embodiment, the ingot 200 is moved relative to the focal point 401 in the second direction, which intersects, at right angles, the first direction 300 with the off-angle α formed therein, in the cleavage layer creation processing that forms the cleavage layers 206 in the ingot 200. In the index-feeding, the ingot 200 is also moved relative to the focal point 401 in the first direction 300 in which the off-angle α is formed. In this regard, the direction of the relative movement of the ingot 200 and the focal point 401 in the cleavage layer creation processing may not be the second direction 301 that intersects, at right angles, the first direction 300 with the off-angle α formed therein. Further, the direction of the relative movement of the ingot 200 and the focal point 401 in the index-feeding may not be the first direction 300 with the off-angle α formed therein.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A production method of a wafer from a single-crystal SiC ingot having a planar end face, a c-axis, and a c-plane that intersects the c-axis at right angles, the method comprising:
    a cleavage layer creation step of applying a laser beam of a wavelength having transmissivity through single-crystal SiC to the planar end face of the single-crystal SiC ingot, with a focal point of the laser beam positioned in the single-crystal SiC ingot at a wafer depth that is a depth corresponding to a thickness of the wafer to be produced, and then repetitively moving the single-crystal SiC ingot and the focal point relative to each other in a direction parallel to the end face such that multiple cleavage layers each of which contains a modified portion and cracks formed isotropically from the modified portion in the c-plane are created; and
    a wafer production step of, after performing the cleavage layer creation step, ejecting ultrasonic water to which ultrasonic vibrations have propagated, from an ultrasonic water ejection nozzle against the end face of the single-crystal SiC ingot, the end face being on a side where the wafer is to be produced, and at a same time, moving the single-crystal SiC ingot and the ultrasonic water ejection nozzle relative to each other in the direction parallel to the end face, thereby severing the wafer along the cleavage layers as starting interfaces to produce the wafer.

2. The production method according to claim 1, wherein, in the single-crystal SiC ingot, the c-axis is inclined at an off-angle relative to a normal to the end face, and an angle equal to the off-angle is formed between the c-plane and the end face, and
the cleavage layer creation step includes linearly moving the focal point of the laser beam applied to the end face, along a second direction intersecting, at right angles, a first direction that is a direction with the off-angle formed therein, so as to continuously form, along the second direction, one of the cleavage layers each of which contains the modified portion and the cracks, index-feeding the single-crystal SiC ingot and the focal point relative to each other in the first direction in a range not exceeding a width of the cracks, and then alternately repeating the linear moving and the index-feeding so as to sequentially form the multiple cleavage layers along the second direction.

3. The production method according to claim 1, wherein the ultrasonic water ejection nozzle includes
    a dome-shaped ultrasonic transducer that has a recessed surface and generates ultrasonic vibrations when supplied with high-frequency electric power,
    a ring-shaped plate extending outward from an outer periphery of the ultrasonic transducer, and
    a box supporting the ring-shaped plate and having a water-holding portion that holds water on a side of the recessed surface of the ultrasonic transducer, a water supply port that supplies water to the water-holding portion, and an ejection bore that opposes the recessed surface of the ultrasonic transducer and ejects the water from the water-holding portion, and
the wafer production step includes supplying the high-frequency electric power to the ultrasonic transducer so as to form, in the ejection bore, a point of concentration of the ultrasonic vibrations generated from the ultrasonic transducer.

4. The production method according to claim 3, wherein the high-frequency electric power has a frequency of 20 kHz to 1 MHz.

5. The production method according to claim 1, further comprising:
    a peeling step of peeling the wafer that has been severed in the wafer production step, from a rest of the single-crystal SiC ingot by peeling means; and a rinsing step of, after performing the peeling step, rinsing a severed surface of the wafer by using the ultrasonic water ejection nozzle.

\* \* \* \* \*